United States Patent
Meyer

(10) Patent No.: US 10,056,352 B2
(45) Date of Patent: Aug. 21, 2018

(54) HIGH DENSITY CHIP-TO-CHIP CONNECTION

(71) Applicant: Intel IP Corporation, Santa Clara, CA (US)

(72) Inventor: Thorsten Meyer, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/329,717

(22) Filed: Jul. 11, 2014

(65) Prior Publication Data

US 2016/0013153 A1    Jan. 14, 2016

(51) Int. Cl.
*H01L 25/065* (2006.01)
*H01L 25/10* (2006.01)
(Continued)

(52) U.S. Cl.
CPC .......... *H01L 25/0655* (2013.01); *H01L 24/24* (2013.01); *H01L 24/25* (2013.01);
(Continued)

(58) Field of Classification Search
CPC ....... H01L 2924/00; H01L 2224/48227; H01L 2224/32225; H01L 2224/73204;
(Continued)

(56) References Cited

U.S. PATENT DOCUMENTS 6,472,747 B2    10/2002  Bazarjani et al.
8,183,696 B2 *   5/2012  Meyer .................. H01L 25/16
                                                        257/734
(Continued)

FOREIGN PATENT DOCUMENTS

CN    102077344 A    5/2011
CN    102918648 A    2/2013
(Continued)

OTHER PUBLICATIONS

"Japanese Application Serial No. 2015-126181, Office Action dated May 10, 2016", W/ English Translation, 8 pgs.
(Continued)

*Primary Examiner* — Joseph C Nicely
*Assistant Examiner* — Thai T Vuong
(74) *Attorney, Agent, or Firm* — Schwegman Lundberg & Woessner, P.A.

(57) ABSTRACT

An apparatus includes at least a first IC die and a second IC die. Bottom surfaces of the first and second IC dice include a first plurality of connection pads and top surfaces of the first and second IC dice include a second plurality of connection pads. The apparatus also includes a layer of non-conductive material covering the top surfaces of the first and second IC dice, a plurality of through-vias, first conductive interconnect between at least a portion of the first plurality of connection pads and at least one through via, and second conductive interconnect on a top surface of the layer of non-conductive material that provides electrical continuity between at least a portion of the second plurality of connection pads and at least one through-via of the plurality of through-vias.

16 Claims, 7 Drawing Sheets

(51) Int. Cl.
*H01L 23/538* (2006.01)
*H01L 23/52* (2006.01)
*H01L 23/00* (2006.01)
*H01L 21/56* (2006.01)

(52) U.S. Cl.
CPC .............. *H01L 24/81* (2013.01); *H01L 24/82* (2013.01); *H01L 24/96* (2013.01); *H01L 24/97* (2013.01); *H01L 25/0652* (2013.01); *H01L 21/568* (2013.01); *H01L 2224/04105* (2013.01); *H01L 2224/12105* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01); *H01L 2224/24137* (2013.01); *H01L 2224/2518* (2013.01); *H01L 2224/8203* (2013.01); *H01L 2225/06513* (2013.01); *H01L 2225/06517* (2013.01); *H01L 2225/06541* (2013.01); *H01L 2225/06562* (2013.01); *H01L 2924/15311* (2013.01)

(58) Field of Classification Search
CPC ..... H01L 25/0652; H01L 24/96; H01L 24/25; H01L 24/24; H01L 24/82
USPC .................................................. 257/686, 737
See application file for complete search history.

(56) References Cited

U.S. PATENT DOCUMENTS

| | | | | |
|---|---|---|---|---|
| 8,629,546 | B1* | 1/2014 | Scanlan | H01L 24/19 257/686 |
| 2002/0180041 | A1* | 12/2002 | Sahara | H01L 23/3114 257/738 |
| 2004/0178495 | A1* | 9/2004 | Yean | H01L 23/5389 257/723 |
| 2005/0046002 | A1* | 3/2005 | Lee | H01L 21/76898 257/678 |
| 2006/0278979 | A1* | 12/2006 | Rangel | H01L 23/481 257/734 |
| 2009/0008762 | A1* | 1/2009 | Jung | H01L 23/5389 257/686 |
| 2009/0008793 | A1 | 1/2009 | Pohl et al. | |
| 2009/0302435 | A1* | 12/2009 | Pagaila | H01L 21/561 257/659 |
| 2010/0133704 | A1 | 6/2010 | Marimuthu et al. | |
| 2010/0144101 | A1* | 6/2010 | Chow | H01L 21/561 438/127 |
| 2010/0213610 | A1* | 8/2010 | Marimuthu | H01L 23/3121 257/737 |
| 2011/0068468 | A1* | 3/2011 | Lin | H01L 23/49816 257/737 |
| 2011/0193225 | A1 | 8/2011 | Chen et al. | |
| 2011/0204505 | A1 | 8/2011 | Pagaila et al. | |
| 2013/0292844 | A1 | 11/2013 | Oh | |

FOREIGN PATENT DOCUMENTS

| | | | |
|---|---|---|---|
| JP | 2006147869 | A | 6/2006 |
| JP | 2009152616 | A | 7/2009 |
| JP | 2010245536 | A | 10/2010 |
| JP | 2011527113 | A | 10/2011 |
| JP | 2012216601 | A | 11/2012 |
| JP | 2013530511 | A | 7/2013 |
| WO | WO-2012006063 | A2 | 1/2012 |

OTHER PUBLICATIONS

"Japanese Application Serial No. 2015-126181, Response filed Aug. 9, 2016 Office Action dated May 10, 2016", W/ English Claims, 13 pgs.

"Taiwanese Application Serial No. 104117980, Office Action dated Oct. 27, 2016", W/Enalish Translation, 14 pgs.

"Chinese Application Serial No. 201510317837.3, Office Action dated Jun. 28, 2017", w/English Translation, 22 pgs.

"Japanese Application Serial No. 2015-126181, Examiners Decision of Final Refusal dated Jan. 24, 2017", w/English Translation, 4 pgs.

"Chinese Application Serial No. 201510317837.3, Office Action dated Feb. 9, 2018", w/English Translation, 24 pgs.

"Chinese Application Serial No. 201510317837.3, Response Filed Nov. 13, 2017 to Office Action dated Jun. 28, 2017", 3 pgs.

"Japanese Application Serial No. 2015-126181, Office Action dated Aug. 29, 2017", W/English Translation, 6 pgs.

"Japanese Application Serial No. 2015-126181, Response Filed Nov. 24, 2017 to Office Action dated Aug. 29, 2017", (W/ English Claims), 5 pgs.

"Korean Application Serial No. 2015-0082003, Notice of Preliminary Rejection dated Mar. 9, 2018", W English Translation, 17 pgs.

\* cited by examiner

HIGH DENSITY CHIP-TO-CHIP CONNECTION

TECHNICAL FIELD

Embodiments pertain to packaging of integrated circuits (ICs). Some embodiments relate to IC package interconnection of integrated circuits.

BACKGROUND

Electronic systems often include integrated circuits (ICs) that are connected to a subassembly such as a substrate or motherboard. The ICs can be packaged and inserted into an IC package that is mounted on the subassembly. As electronic system designs become more complex, it is a challenge to meet the desired size constraints of the system. One aspect that influences the overall size of a design is the spacing required for the interconnection of the contacts of the IC packages. As the spacing is reduced, the packaged ICs can become less robust and the cost of meeting the spacing requirements can increase. Thus, there are general needs for devices, systems and methods that address the spacing challenges for contacts of ICs yet provide a robust and cost effective design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The demand for increased computing power in smaller devices has led to increased use of System in Packages (SiP) to meet the demands of system integration. For example, digital and analog portions of an electronic system can be separated and built using two different technology nodes; a high-end sophisticated integrated circuit (IC) manufacturing process for the digital portion and a low-end process for the analog portion. The two portions can be included in two different IC dice which can be integrated at a package level into a side-by-side SiP. However, this integration scheme may require many connections between the two IC dice. This interconnection between IC dice may require very fine metal line pitch and spacing, and may require multiple routing layers. There may also be an electrical performance trade-off between inter-chip signal speed and reduced physical dimensions.

Additionally, using a finer pitch to accommodate increased integrated circuit input/output (I/O) can lead to expensive packaging processes to accommodate the finer geometries associated with the width of interconnection lines, spacing between interconnection, and spacing to protect against electro-migration between interconnect. This can lead to packaging requirements that conflict with the need for lower cost.

Typically, only one side of an IC die is used for I/O. IC connection pads are formed on a surface of a wafer when the IC dice are manufactured. The individual die are separated and are mounted (e.g., in a Flip Chip configuration) with the connection pad side or front side face down on a ceramic substrate or printed circuit board (PCB) for connection to other devices. Using the back side of the IC dice for interconnection and routing in addition to the front side can greatly increase the amount of space available for I/O routing. This allows the routing for an IC to be implemented with less aggressive spacing and routing requirements.

Figure 1:
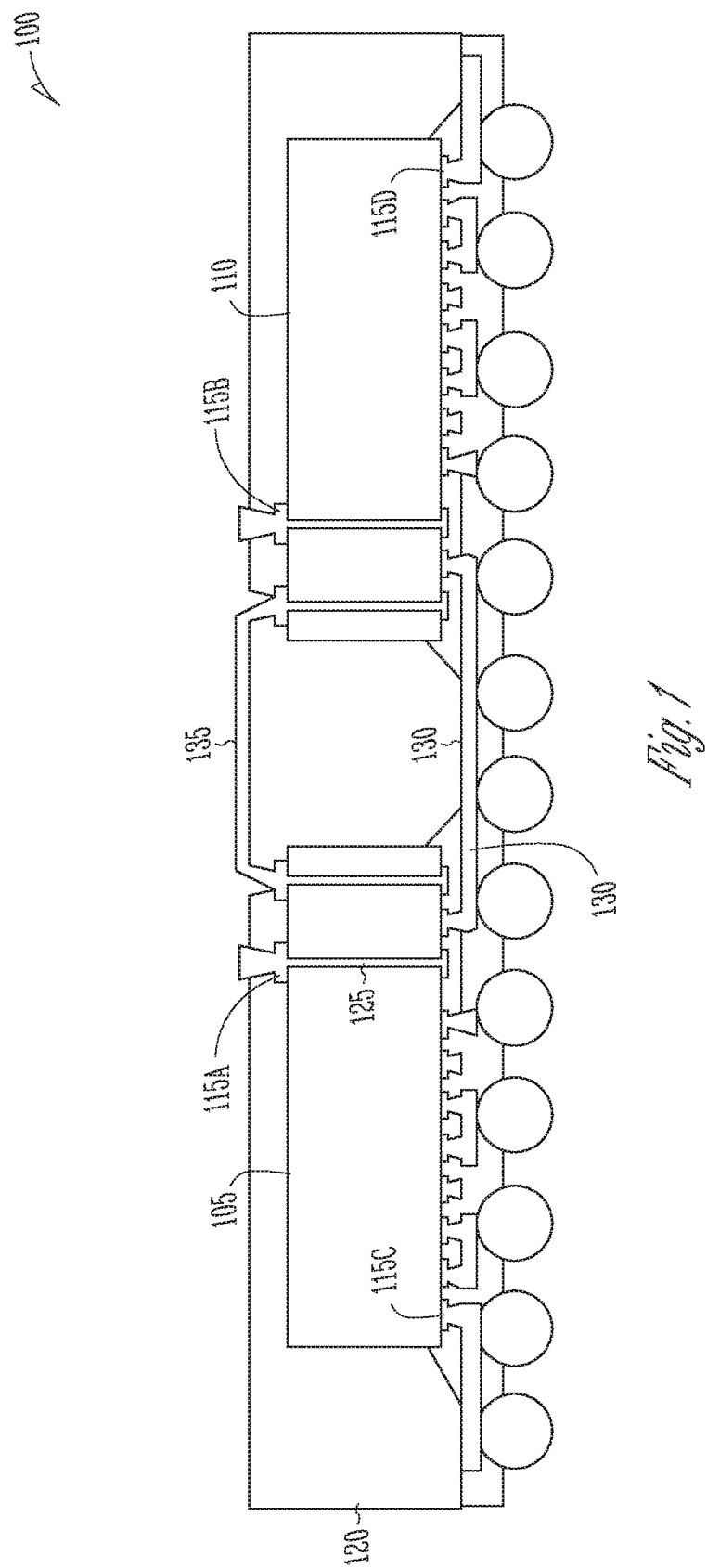
FIG. 1 illustrates portions of an example of an electronic device that includes system level electronic packaging in accordance with some embodiments.

FIG. 1 illustrates portions of an example of an electronic device that includes system level electronic packaging. The device 100 includes a first IC die 105 and a second IC die 110. In certain variations, one of the IC dice includes digital circuits and the other die includes analog circuits or mostly analog circuits. In some variations, the device 100 includes more than two IC dice. Both of the IC dice include a top surface and a bottom surface. An IC die may have an orientation flipped or inverted from the orientation of the IC die when it was manufactured on a wafer, such that the top surface shown in FIG. 1 corresponds to the back side of a wafer from which the IC die was formed.

The device 100 includes multiple through-vias. In the example shown in the Figure, the through-vias include at least one through-silicon-via 125 (TSV). In certain examples, both of the dice include at least one TSV. A TSV is formed in the IC die typically to extend through the IC die from the bottom surface to the top surface of the IC die. TSVs can be formed during the process in which the IC was formed, or a TSV can be added after the IC is formed (e.g., by drilling an opening in the IC die and filling the opening with conductive material). A TSV can provide electrical continuity between the bottom surface and the top surface of the IC die. In the example of FIG. 1, electrical contact is made to the top of the TSV by forming an opening in the layer of non-conductive material 120 to the top surface of the IC die.

The top surfaces of the ICs include a first plurality of connection pads (e.g., 115A, 115B). The bottom surfaces of the ICs include a second plurality of connection pads (e.g., 115C, 115D). In the example of FIG. 1, the first plurality of connection pads contact the top end of the through-vias. The second plurality of connection pads contact the bottom end of the through-vias and contact the active circuits of the IC dice. A layer of non-conductive material 120 covers the top surfaces of the first and second IC dice. The conductive material may also cover the sides of the first and second IC dice as shown in the example of FIG. 1.

The device 100 also includes electrically conductive interconnect 130 to provide electrical continuity between at least a portion of the connection pads on the bottom surface of the IC dice, including continuity between one or more connection pads of the first IC die and one or more connection pads of the second IC die. The conductive interconnect can also provide electrical continuity to one or more TSVs at the bottom surface of an IC die.

The device 100 further includes conductive interconnect 135 on a top surface of the layer of non-conductive material. The conductive interconnect 135 can provide electrical continuity between at least a portion of the connection pads on the top surface of the first IC die and at least a portion of connection pads on the top surface of the second IC die. The conductive interconnect 135 can provide electrical continuity to one or more of the TSVs at the top surface of an IC die. In this way, electrical continuity can be provided from a connection pad on the bottom surface of the first IC die, to a through-via, and to a connection pad on the top surface of the second IC die. Similarly, electrical continuity can be provided from a connection pad on the top surface of the first IC die to a through-via and to a connection pad on the bottom surface of the second IC die.

Figure 2A:
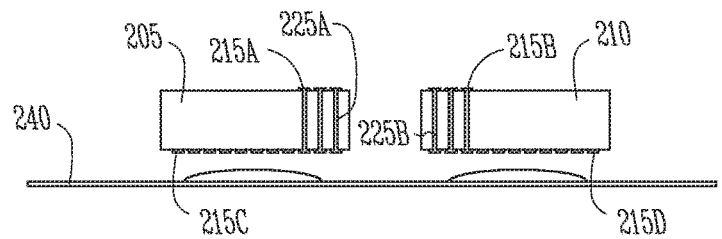
FIGS. 2A-2E illustrate portions of an example of a method of forming system level packaging for an electronic device in accordance with some embodiments.

FIGS. 2A-2E illustrate portions of an example of a method of forming system level packaging for an electronic device. A first IC die 205 and a second IC die 210 are formed to include connection pads. In certain variations, the IC die include a copper pad finish at the connection pad locations. Connection pads (e.g., 215A, 215C) are formed on both a top surface and a bottom surface of the first IC die and on both a top surface and a bottom surface of the second IC die (e.g., 215B, 215D). In the example of FIG. 2A, the IC dice each include TSVs 225A, 225B. The connection pads of the top surface are shown connected to the TSVs, but an IC die may include connection pads on its top surface not connected to a TSV. In the example of FIG. 2A, the IC dice are glued to a thin metal foil 240.

Figure 2B:
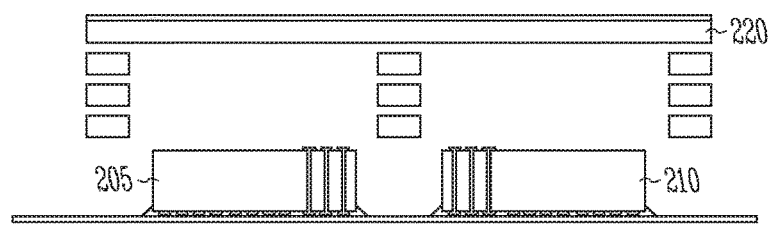

In FIG. 2B, at least the top surfaces of the first and second IC dice are covered using a layer of non-conductive material 220 to form a subassembly. Some examples of the non-conductive material can include, among other things, a moldable plastic material, an epoxy, a laminate material, or a pre-impregnated or 'prepreg' material. In the example shown, the non-conductive layer also covers the sides of the IC dice and the non-conductive material may consist of multiple laminated or pressed layers.

Figure 2C:
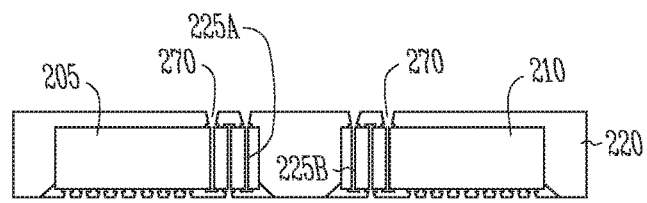

In FIG. 2C, through-vias are formed in the subassembly. In the example shown, the through-vias include the TSVs of the IC dice. Through-vias are formed to the top surface of the non-conductive layer by forming openings 270 or vias to the TSVs in the non-conductive layer and filling the openings with conductive material (e.g., metal). The openings 270 in the non-conductive layer can be formed by mechanical drilling or laser drilling. Use of copper in the connection pads may facilitate laser drilling. A copper pad is typically thicker than a pad of other material (e.g., aluminum) and the thicker connection pad may make the laser drilling easier to control. Vias to other connection pads can also be formed. In the example of FIG. 2C, vias are formed through the thin metal foil of FIG. 2A and the adhesive or glue to at least a portion of connection pads on the bottom surfaces of the ICs. In certain variations, the vias to connection pads are formed on the top surface and the bottom surface of an IC die at the same time.

Figure 2D:
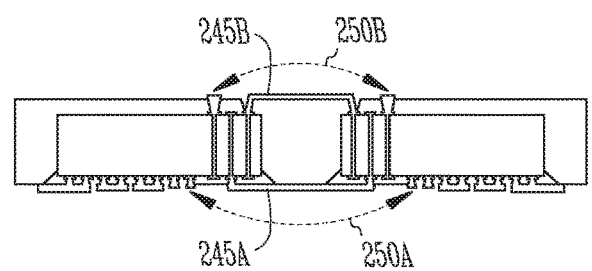

In FIG. 2D, electrical connections are made to the connection pads on the top surface and bottom surface. First electrically conductive interconnect 245A (e.g., metal traces) is formed between at least a portion of the connection pads on the bottom surfaces of the first and second IC dice. At least a portion of the conductive interconnect 245A is used for die to die connections and at least a portion of the conductive interconnect 245A is used to form an electrical connection to at least one TSV. In some examples, the conductive interconnect 245A is formed through patterning of the thin metal foil.

Second electrically conductive interconnect 245B is formed on the top surface of the layer non-conductive material to provide electrical interconnect between at least a portion of the connection pads on the top surfaces of the first IC die and the second IC die. At least a portion of the conductive interconnect is used for die to die connections and at least a portion of the conductive interconnect is used to form an electrical connection to at least one TSV. The arrows 250A, 250B indicate electrical connections by the conductive interconnect that can be present but are not visible in the cross sectional illustration in the FIG. 2D. Additional layers can be included to provide crossovers for the conductive interconnect or to provide landing pads for solder balls. The additional top surface routing reduces the routing density from what the density would be if routing was limited to only the bottom surface.

Figure 2E:
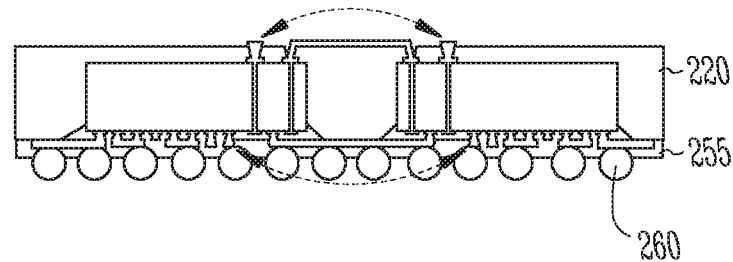

FIG. 2E shows that solder bumps or solder balls can be added to the device. To accommodate the solder bumps, a solder stop layer 255 may be added to the bottom surface. The solder stop layer 255 includes a layer of insulating material and also includes openings for mounting the solder bumps 260. Solder bumps 260 are then mounted to the solder stop layer. Through use of the conductive interconnect and through-vias, electrical continuity can be provided between at least one landing pad and at least one connection pad on the top side of at least one of the first and second IC dice. The solder stop layer 255 may be arranged over a redistribution layer (e.g., applied along with the electrical connections 245A and 250A) that routes conductive interconnect between a connection pad and a landing pad and a solder bump. In some examples, there may be several system level packages being formed at the same time and sharing a same platform (e.g., sharing a substrate). The individual system level packages may be separated such as by sawing for example.

Figure 3:
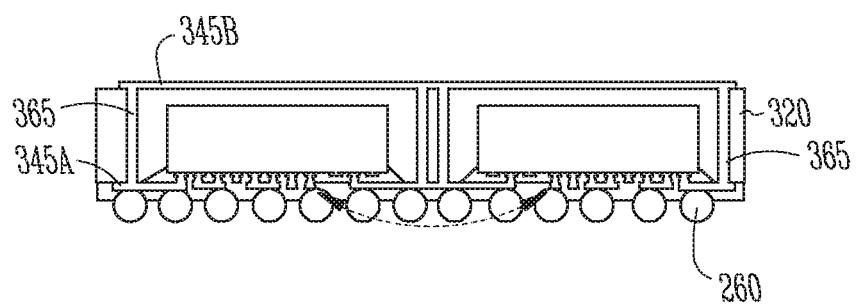
FIG. 3 illustrates portions of another example of an electronic device that includes system level packaging in accordance with some embodiments.

FIG. 3 illustrates portions of another example of an electronic device that includes system level packaging. FIGS. 1 and 2A-2E show examples where a through-via includes a TSV. However, TSVs may not be available in a given IC process or a process with TSV capability is not selected (e.g., for reasons of cost). In the example shown in FIG. 3, electrical continuity between the bottom surface and the top surface of an IC die is implemented using a through-via formed in the layer of non-conductive material 320. If the non-conductive material is molded laminate, the through-via can be called a through-mold-via 365 or TMV. A TMV can be formed by drilling (e.g., laser drilling or mechanical drilling) to form an opening, which is then filled with electrically conductive material. It may also be an embedded, pre-formed piece of silicon, PCB, laminate, or ceramic, which includes vertical connections. In certain variations, the system level package includes both TSVs and TMV. Conductive interconnect 345A on the bottom side and the conductive interconnect on the top surface 345B can be used to form electrical continuity to the through-vias. For instance, conductive interconnect can form electrical continuity between a connection pad of the top surface of an IC die, the through-via, and a connection pad on the bottom surface of the same or a different IC die. Because the routing to a through-via is short, using non-TSV through-vias can still reduce the routing density of the system level package.

Figure 4A:
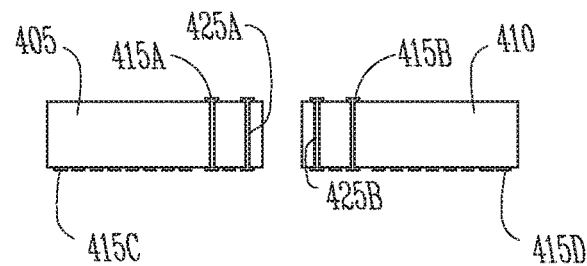
FIGS. 4A-4G illustrate portions of an example of a method of forming system level electronic packaging for an electronic device in accordance with some embodiments.

FIGS. 4A-4H illustrate portions of an example of a method of forming system level packaging for an electronic device. In the example, the method examples of FIGS. 2A-2E are applied to improve fan-out wafer level packaging. A first IC die 405 and a second IC die 410 are formed to include connection pads. Connection pads (e.g., 415A, 415C) are formed on both a top surface and a bottom surface of the first IC die, and on both a top surface and a bottom surface of the second IC die (e.g., 415B, 415D). In the example of FIG. 4A, the IC dice each include TSVs 425A, 425B. The IC dice can be placed on a mold carrier.

Figure 4B:
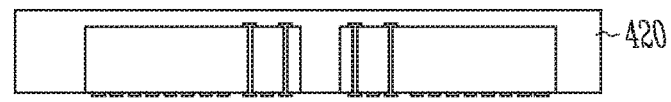
Figure 4C:
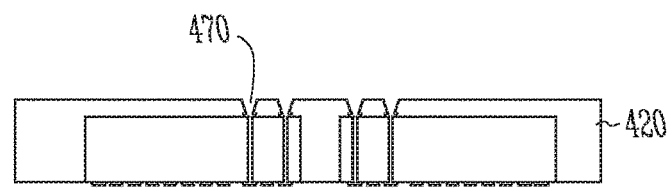

In FIG. 4B, a molded layer 420 is formed over the first and second IC dice to form a subassembly. The molded layer 420 typically is non-conductive. In some variations, the molded layer 420 is formed by compression molding, and in certain variations, the molded layer 420 includes epoxy. In FIG. 4C, openings 470 are formed in the molded layer 420 to contact the TSVs. The opening in the non-conductive layer can be formed by laser drilling or etching.

Figure 4D:
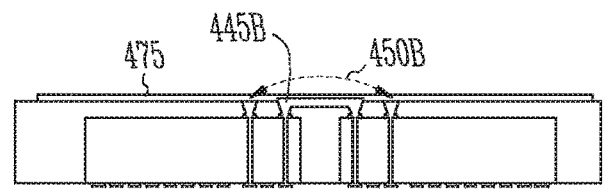

In FIG. 4D, the openings are shown filled with electrically conductive material. A redistribution layer 475 is formed on top of the molded layer 420 that includes electrically conductive interconnect 445B, 450B. At least a portion of the conductive interconnect includes die-to-die connections. The connections can be formed using thin-film technology (e.g., sputtering and plating), PCB technology, other technology, or combination of technologies. The redistribution layer 475 can include a passivation layer or passivation coating that protects the conductive interconnect.

Figure 4E:
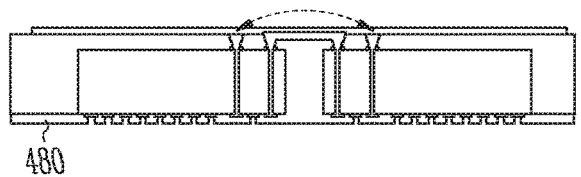

In FIG. 4E, an optional dielectric layer 480 is formed on the bottom surfaces of the IC dice. Openings can be formed in the dielectric layer to access the connection pads on the bottom surfaces of the IC dice. Some conductive interconnect between connection pads may be formed prior to forming the dielectric layer 480 and then covered by the dielectric layer 480.

Figure 4F:
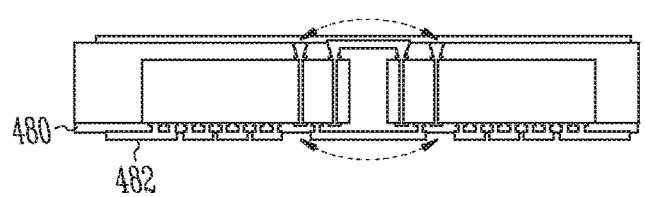
Figure 4G:
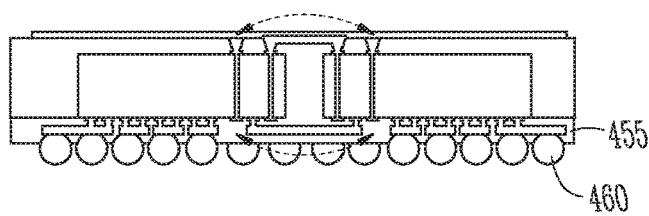

In FIG. 4F, another redistribution layer 482 is applied onto the optional dielectric layer 480. The redistribution layer 482 can be used for die-to-die connections and connections to landing pads for solder bumps. In FIG. 4G, a solder stop layer 455 is added to the bottom surface. The solder stop layer 455 includes openings for pads for mounting the solder balls 460. In some examples, the process examples shown in FIGS. 4D-4G can be performed simultaneously on the top and bottom sides.

Figure 5:
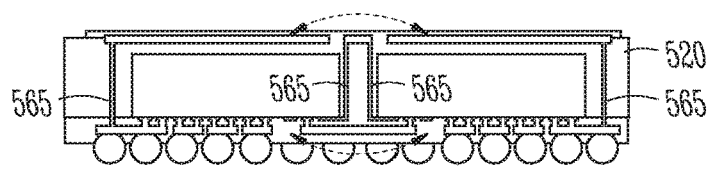
FIG. 5 illustrates portions of another example of an electronic device that includes system level packaging in accordance with some embodiments.

FIG. 5 illustrates portions of another example of an electronic device that includes system level packaging. This approach may be useful when TSVs are not available in the IC process. As in the example of FIG. 3, through-vias 565 can be formed in the molded layer 520. In some variations, the through-vias 565 are fabricated by forming openings by laser drilling and then filling the openings with electrically conductive material. In some variations, the through-vias 565 are pre-fabricated using printed circuit board material or silicon material.

Figure 6:
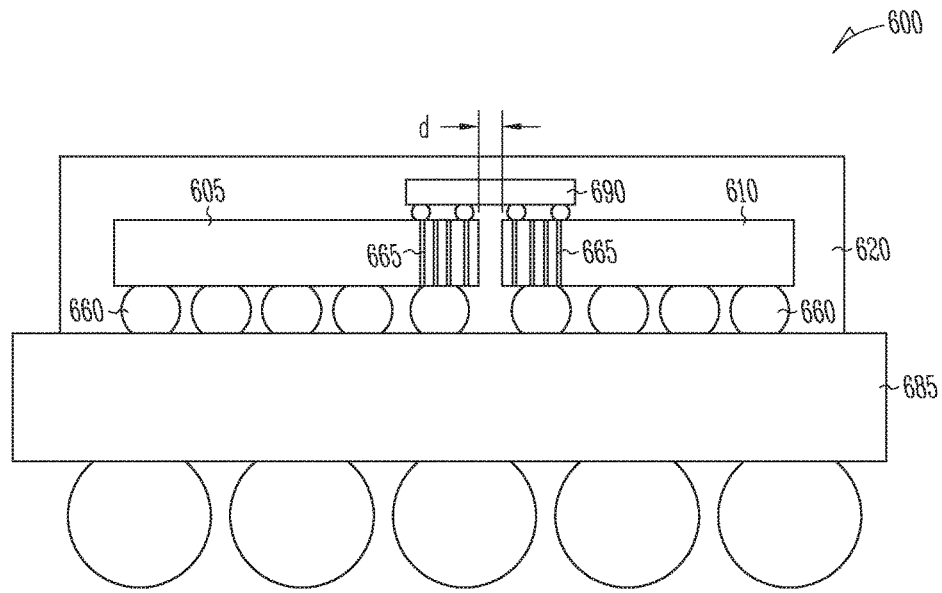
FIG. 6 illustrates portions of still another example of an electronic device that includes flip-chip technology in the system level packaging in accordance with some embodiments.

FIG. 6 illustrates portions of still another example of an electronic device that includes flip-chip technology in the system level packaging. In the example shown, two IC dice 605, 610 are arranged (e.g., side by side) on a substrate 685 (e.g., a flip-chip substrate). When mounting the IC dice, the distance d between them can be made as small as possible.

The device 600 includes multiple bond layers. There is a first bond layer between the bottom surfaces of first and second IC dice and a first side (the top side in the example of FIG. 6) of the substrate 685. The bottom surface of the first IC die and the bottom surface of the second IC die each include one or more bond pads to provide for attachment of solder bumps or copper pillars to the bottom surfaces. The IC dice may be attached to the substrate 685 by, among other things, a mass reflow process or by thermo-compression bonding. The thermo-compression bonding approach may provide more accurate bonding to the substrate 685.

The device 600 includes a second bond layer between a bridge component 690 and the top surfaces of the first IC die 605 and second IC die 610. The top surfaces of the IC dice include landing pads for solder bumps (e.g., micro-solder balls) for attachment of the bridge component 690. The bridge component 690 may be an active or a passive device, and can include silicon, a PCB, ceramic, or another IC dice and includes electrically conductive interconnect routing. The bridge component forms part of the second electrically conductive interconnect (e.g., die-to-die) at the top surfaces of the IC dice. The bridge component 690 is electrically connected to connection pads of the IC dice. The conductive interconnect provides electrical continuity from a bond pad of the first IC die through the bridge component to a bond pad of the second IC die. In the example shown, the IC dice include TSVs 665. In some examples, the bridge component 690 provides electrical continuity between the TSVs 665 of the IC dice.

The device 600 includes a plurality of bond pads arranged on the second side of the substrate (the bottom side in the example of FIG. 6) and solder bumps can be arranged on at least a portion of the bond pads. This provides a third bond layer for bonding the device 600 to a system level PCB (e.g., a motherboard) or ceramic substrate.

Providing routing on both sides of the IC dice may allow routing of a less fine pitch to be used for connections between IC dice. Routing on both sides of an IC die may also be useful for a one IC die package that has a large amount of I/O and would typically have a high contact pad density. Routing to all of the pads and to solder bumps positions may be difficult when they are arranged exclusively under the IC, and the routing may require an expensive process for multi-layer distribution and the process may result in reduced electrical performance.

Figure 7:
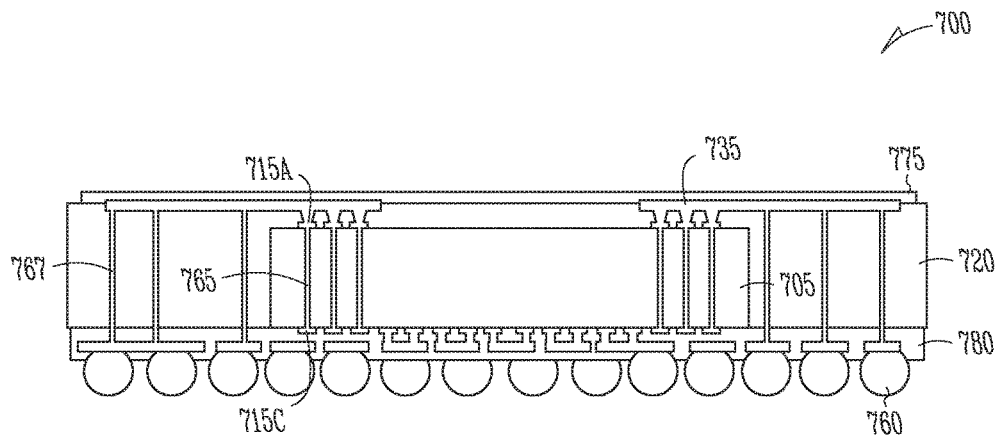
FIG. 7 illustrates an example of packaging for an electronic device in accordance with some embodiments.

FIG. 7 illustrates another example of packaging for an electronic device. The device 700 includes an IC die 705 having a top surface and a bottom surface, and each of the top surface and the bottom surface include a plurality of connection pads 715A, 715C. A layer of non-conductive material 720 covers the top surface and substantially covers the side surfaces of the IC die 705. The non-conductive material can include molded laminate or reconstituted wafer.

The device includes a plurality of through-vias. The through-vias can be formed in one or both of the IC Die 705 and the layer of non-conductive material 720, and the through-vias can include one or both of a TMV767 and a TSV765. The device 700 includes conductive interconnect that provides electrical continuity to at least a portion of the connection pads on the bottom surface of the IC die and to at least a portion of the through-vias. In the example shown, the bottom surface of the IC die is arranged on first side of a substrate 780. The through-vias may extend from the top surface of the layer of non-conductive material 720 to the substrate 780.

The device 700 includes conductive interconnect 735 on a top surface of the layer of non-conductive material 720.

The conductive interconnect on the top surface provides electrical continuity to at least a portion of the connection pads on the top surface of the IC die 705 and to at least a portion of the through-vias. In some variations, the top surface of the layer of non-conductive material 720 includes a redistribution layer 775. At least a portion of the conductive interconnect can be included in the redistribution layer.

The second side of the substrate 780 can include bond pads or landing pads (e.g., in a solder stop layer). The substrate 780 may include a redistribution layer to provide electrical continuity between connection pads on the bottom surface of the IC to the landing pads and solder bumps 760 formed on the landing pads. In some examples, the conductive interconnect on the bottom surface provides electrical continuity between at least a portion of the through-vias and the bond pads. In this way, connections to the top surface of the IC die 705 can be routed to a landing pad without adding to the routing under the IC die 705.

Figure 8:
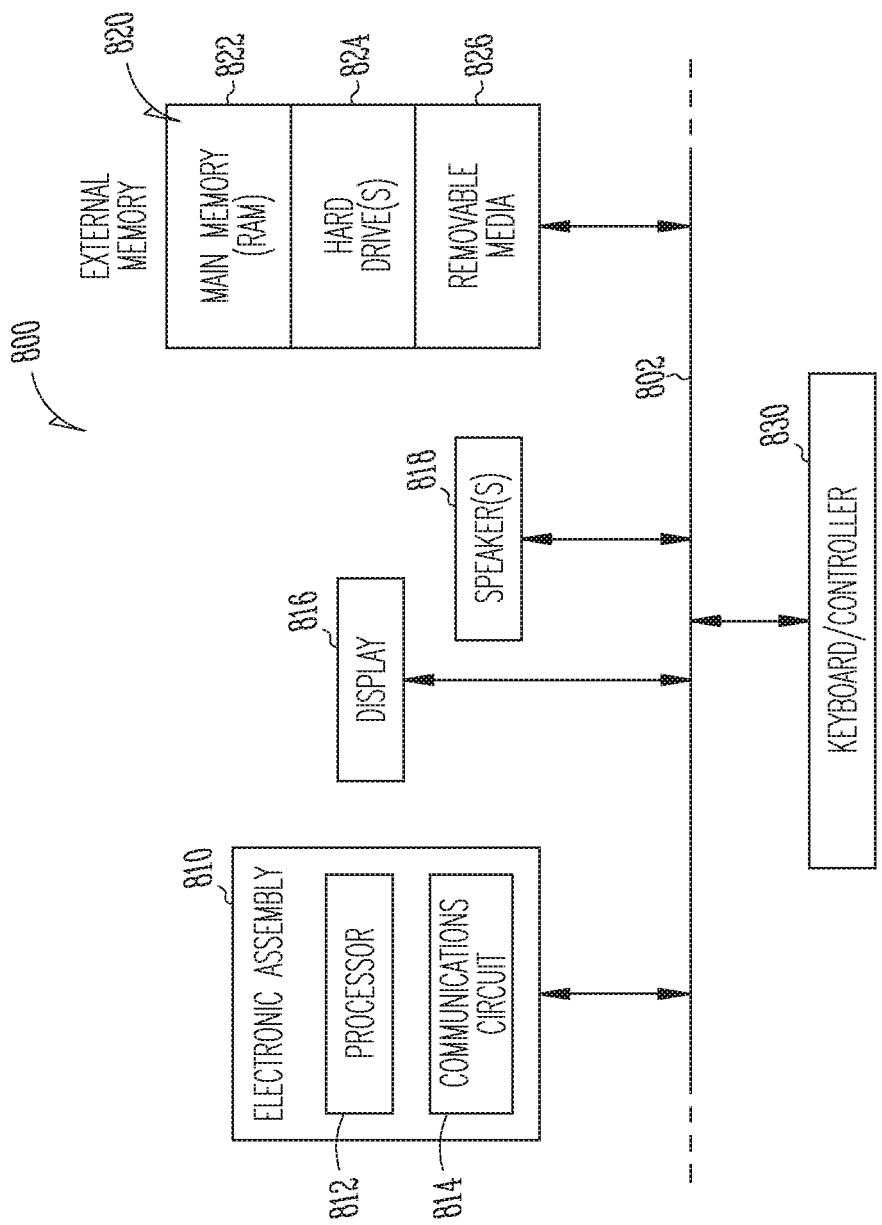
FIG. 8 is a block diagram of an example of an electronic system in accordance with some embodiments.

An example of an electronic device using assemblies with system level packaging as described in the present disclosure is included to show an example of a higher level device application. FIG. 8 is a block diagram of an example of an electronic system 800 incorporating an IC device package and/or method in accordance with at least one embodiment. Electronic system 800 is merely one example of an electronic system in which embodiments can be used. Examples of electronic systems include, but are not limited to personal computers, tablet computers, mobile telephones, game devices, MP3 or other digital music players, etc. In this example, electronic system 800 comprises a data processing system that includes a system bus 802 to couple the various components of the system. System bus 802 provides communications links among the various components of the electronic system 800 and can be implemented as a single bus, as a combination of busses, or in any other suitable manner.

An electronic assembly 810 is coupled to system bus 802. The electronic assembly 810 can include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 810 are a custom circuit, an application-specific integrated circuit (ASIC), or the like, such as, for example, one or more circuits (such as a communications circuit 814) for use in wireless devices like mobile telephones, personal data assistants, portable computers, two-way radios, and similar electronic systems. The IC can perform any other type of function.

The electronic system 800 can also include an external memory 820, which in turn can include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic system 800 can also include a display device 816, one or more speakers 818, and a keyboard and/or controller 830, which can include a mouse, trackball, touch screen, voice-recognition device, or any other device that permits a system user to input information into and receive information from the electronic system 800.

The devices, systems, and methods described can significantly reduce routing density of interconnection between ICs for a multichip package in comparison to conventional multichip packaging approaches. Examples described herein include two IC dice for simplicity, but one skilled in the art would recognize upon reading this description that the examples can include more the two IC dice. The devices, systems, and methods described can also reduce routing density for a single chip package that includes a high number of I/O connections.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   at least a first integrated circuit (IC) die and a second IC die, wherein bottom surfaces of the first and second IC dice include a first plurality of connection pads and top surfaces of the first and second IC dice include a second plurality of connection pads;
   a layer of non-conductive material covering the top surfaces of the first and second IC dice, the layer of non-conductive material having a bottom surface contacting the first and second IC dice and a top surface opposite the bottom surface;
   a plurality of through-vias including at least one through-via in the first IC die extending from a bottom surface of the first IC die through the IC die and through the layer of non-conducting material to the top surface of the layer of non-conducting material, and at least one through-via in the second IC die extending from a bottom surface of the first IC die through the IC die through the layer of non-conducting material to the top surface of the layer of non-conducting material;
   first conductive interconnect between at least a portion of the first plurality of connection pads and at least one through via of the plurality of through-vias; and
   second conductive interconnect on the top surface of the layer of non-conductive material that provides electrical continuity between at least a portion of the second plurality of connection pads and the through-vias of the of the first IC and second IC dice.

2. The apparatus of claim 1, wherein at least one through-via of the plurality of through-vias is included in the layer of non-conductive material and extends to the top surface of the layer of non-conductive material, and the second conductive interconnect provides electrical continuity to the at least one through-via included in the layer of non-conductive material.

3. The apparatus of claim 1, wherein the layer of non-conductive material includes a molded layer of laminate material over the first and second IC dice.

4. The apparatus of claim 1, wherein the layer of non-conductive material includes a molded layer of reconstituted wafer over the first and second IC dice.

5. The apparatus of claim 4, including a redistribution layer on at least one of the top surface and bottom surface of the first and second IC dice, wherein at least one of a portion of the first conductive interconnect or a portion of the second conductive interconnect is included in the redistribution layer.

6. The apparatus of claim 1, including one or more landing pads on a bottom side of the IC dice and at least one through-via of the plurality of through-vias provides electrical continuity between at least one landing pad and the second conductive interconnect.

7. The apparatus of claim 1, wherein the second conductive interconnect includes a bridge component arranged on the top surfaces of the first and second IC dice.

8. The apparatus of claim 7, including:
a substrate, wherein the first and second IC dice are arranged on the substrate;
a first bond layer between the bottom surfaces of first and second IC dice and a first side of the substrate;
a second bond layer between the bridge component and the top surfaces of the first and second IC dice; and
a plurality of bond pads arranged on the second side of the substrate and solder bumps arranged on at least a portion of the bond pads.

9. The apparatus of claim 7, including one or more bonds pads on each of the bottom surfaces of the first IC die and the second IC die and the first conductive interconnect provides electrical continuity between a bond pad of the first IC die and the at least one through-via of the first IC die and electrical continuity between a bond pad of the second IC die and the at least one through-via of the second IC die, and the second conductive interconnect provides electrical continuity between the at least one through-via of the first IC die and the at least one through-via of the second IC die.

10. The apparatus of claim 1, wherein the first IC die includes only digital circuits and the second IC die includes analog circuits.

11. An apparatus comprising:
an integrated circuit (IC) die including a top surface and a bottom surface, wherein the bottom surface includes a first plurality of connection pads and the top surface includes a second plurality of connection pads;
a layer of non-conductive material covering the top surface and substantially covering the side surfaces of the IC die, the layer of non-conductive material having a bottom surface contacting the IC dice and a top surface opposite the bottom surface;
a plurality of through-vias including at least one through mold via (TMV) formed through the layer of non-conductive material and at least one through silicon via (TSV) formed in the IC die, wherein the at least one TMV extends through the layer of non-conducting material to the top surface of the layer of non-conductive material, and the at least one TSV extends from the bottom surface of the IC die through the IC die and through the layer of non-conducting material to the top surface of the layer of non-conductive material;
first conductive interconnect that provides electrical continuity to at least a portion of the first plurality of connection pads and the at least one TMV and the at least one TSV; and
second conductive interconnect on the top surface of the layer of non-conductive material that provides electrical continuity to at least a portion of the second plurality of connection pads and to the at least one TMV and the at least one TSV.

12. The apparatus of claim 11, including a substrate, wherein the bottom surface of the IC die is arranged on a first side of the substrate and wherein the apparatus includes a plurality of through-vias extending from a top surface of the layer of non-conducting material to the substrate.

13. The apparatus of claim 12, wherein the second side of the substrate includes bond pads, and wherein the apparatus includes conductive interconnect between at least a portion of the through-vias and the bond pads.

14. The apparatus of claim 11, including a redistribution layer arranged on top surface of the layer of non-conductive material, wherein at least a portion of the second conductive interconnect is included in the redistribution layer.

15. The apparatus of claim 11, wherein the non-conductive layer includes at least one of a layer of molded laminate material or a molded layer of reconstituted wafer.

16. The apparatus of claim 11, wherein the IC die includes a processor.

* * * * *